US 6,678,199 B1

(12) United States Patent
Joo

(10) Patent No.: US 6,678,199 B1
(45) Date of Patent: Jan. 13, 2004

(54) MEMORY DEVICE WITH SENSE AMP EQUILIBRATION CIRCUIT

(75) Inventor: Yangsung Joo, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 6 days.

(21) Appl. No.: 10/175,271

(22) Filed: Jun. 19, 2002

(51) Int. Cl.[7] .................................................. G11C 7/02
(52) U.S. Cl. ........................ 365/207; 365/203; 365/205
(58) Field of Search ............................... 365/207, 203, 365/205, 208, 191, 149

(56) References Cited

U.S. PATENT DOCUMENTS

| 5,668,765 A | * | 9/1997 | Ang ........................... 365/205 |
| 5,923,603 A | * | 7/1999 | Pinney ........................ 365/203 |
| 6,078,538 A | * | 6/2000 | Ma et al. ..................... 365/226 |
| 6,111,803 A | * | 8/2000 | Derner et al. ................ 365/205 |
| 6,240,026 B1 | * | 5/2001 | Laurent et al. ........ 365/189.11 |

* cited by examiner

*Primary Examiner*—Anh Phung
(74) *Attorney, Agent, or Firm*—Williams, Morgan & Amerson, P.C.

(57) ABSTRACT

A device includes first and second data lines, a memory cell, a sense amp, equilibration circuitry, and sense amp equilibration circuitry. The memory cell is coupled to the first and second data lines. The sense amp is coupled to the data lines. The sense amp includes sensing circuitry configured to detect a voltage on the data lines corresponding to charge stored in the memory cell, a first activation line coupled between the sensing circuitry and a pullup voltage source, and a second activation line coupled between the sensing circuitry and a pulldown voltage source. The equilibration circuitry is configured to ground the first activation line and equilibrate the second activation line responsive to an assertion of an equilibrate signal. The sense amp equilibration circuitry is configured to equilibrate the first activation line responsive to an assertion of a sense amp equilibration signal prior to an activation of the second activation line.

37 Claims, 4 Drawing Sheets

MEMORY DEVICE WITH SENSE AMP EQUILIBRATION CIRCUIT

BACKGROUND OF THE INVENTION

1. Field of the Invention

This invention relates generally to the field of integrated memory circuits and, more particularly, to a memory device with sense amp equilibration circuit.

2. Description of the Related Art

Memory circuits, such as dynamic random access memory (DRAM) arrays, have increased in complexity and density over time. With such increased density and complexity, it is very likely that one or more shorts will occur between a word line (generally referred to as a "row" within the array) and a data line (generally referred to as a "column" within the array).

A row-to-column short typically is a point defect that shorts together a particular row line to a perpendicular data line. Such a defect generally ruins the integrity of both the row and column. Spare rows and columns are created within the DRAM array in combination with address redirection circuitry to substitute functional spare rows and columns for those that are shorted, at least to the extent that shorted rows and columns do not exceed the number of spare rows and columns. Even though this on-chip redundancy allows for the repair of a DRAM integrated circuit device, it is important to note that the shorted columns and rows are not disconnected from the array circuitry. The shorted columns and rows are merely no longer addressed by the array's address decode circuitry. Disconnection of the shorted rows and columns from the array circuitry is impractical with presently available technology due to the small pitch used to fabricate DRAM arrays. Schemes for implementing row and column redundancy in DRAM arrays are well known in the art.

The repair of row to column shorts through redirected addressing does not eliminate the presence of shorts within the array, nor does it eliminate the potential for biased voltage pull down with the attendant problems of excessive standby current, read/write operations resulting in invalid data and possible damage to cell capacitors within the array. For example, one serious problem is that of an increase in the quiescent standby current because of a defect in the circuit. In standby mode, all the row lines are actively held to ground, while the digits are ideally held to an intermediate supply voltage known as DVC2 (i.e., half of the operating voltage VCC) in anticipation of a new access. The row-to-column short therefore acts to short DVC2 to ground, giving a much higher standby current than is otherwise necessary or desired. Since such short defects cannot be eradicated entirely, large DRAM arrays have resorted to the use of "bleeder" circuits, which act to limit the amount of supply current that actively holds a digit line to DVC2.

As DRAM array sizes grow, however, row-to-column shorts become more prevalent. As such, there is a desire to reduce the standby current even further to allow the use of dice with a substantial number of row/column shorts and to keep the quiescent standby current in a more tightly controlled range. An exemplary memory device with a bleeder circuit is described in U.S. Pat. No. 6,078,538, entitled "METHOD AND APPARATUS FOR REDUCING BLEED CURRENTS WITHIN A DRAM ARRAY HAVING ROW-TO-ROW COLUMN SHORTS," and incorporated herein by reference in its entirety.

One potential limitation regarding the use of a bleeder circuit is that in some implementations the speed of the sense amp circuitry used to sense the value stored in the memory cells may be reduced. The sense amp circuit typically has activation lines used to activate the data lines responsive to the values stored in the memory cells. To reduce standby currents, one of the activation lines may be grounded prior to a memory read cycle. The signal on the grounded activation line must then pass the entire range from ground to VCC to pull the data line to the desired state. The need for this full range swing reduces the response time of the sense amp circuitry. As operating voltages decrease, the sense amp circuit becomes slower, because of the lower NMOS gate-to-source voltage ($V_{GS}$).

The present invention is directed to overcoming, or at least reducing the effects of, one or more of the problems set forth above.

SUMMARY OF THE INVENTION

One aspect of the present invention is seen in a device including first and second data lines, a memory cell, a sense amp, equilibration circuitry, and sense amp equilibration circuitry. The memory cell is coupled to the first and second data lines. The sense amp is coupled to the data lines. The sense amp includes sensing circuitry configured to detect a voltage on the data lines corresponding to charge stored in the memory cell, a first activation line coupled between the sensing circuitry and a pullup voltage source, and a second activation line coupled between the sensing circuitry and a pulldown voltage source. The equilibration circuitry is configured to ground the first activation line and equilibrate the second activation line responsive to an assertion of an equilibrate signal. The sense amp equilibration circuitry is configured to equilibrate the first activation line responsive to an assertion of a sense amp equilibration signal prior to an activation of the second activation line.

Another aspect of the present invention is seen in a method for reading a memory cell. The method includes providing a memory cell coupled to first and second data lines. Sensing circuitry for sensing a voltage on the data lines corresponding to charge stored in the memory cell is provided. A first activation line is coupled between the sensing circuitry and a pullup voltage source. A second activation line is coupled between the sensing circuitry and a pulldown voltage source. The first activation line is grounded and the second activation line is equilibrated responsive to an assertion of an equilibrate signal. The first activation line is equilibrated responsive to an assertion of a sense amp equilibration signal prior to an activation of the second activation line.

BRIEF DESCRIPTION OF THE DRAWINGS

The invention may be understood by reference to the following description taken in conjunction with the accompanying drawings, in which like reference numerals identify like elements, and in which.

Figure 1:
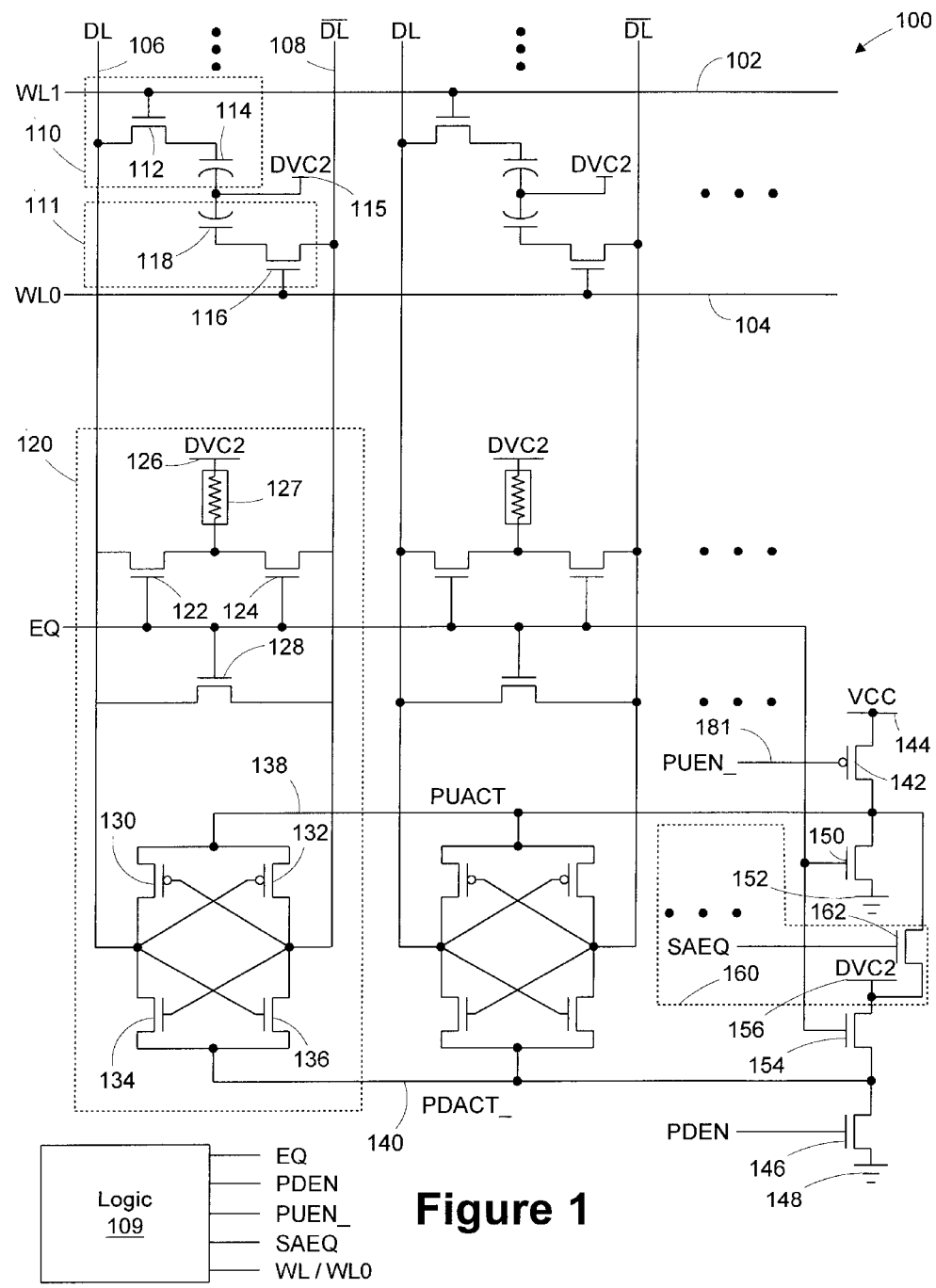
FIG. 1 is a circuit diagram of a portion of a memory device in accordance with one illustrative embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Referring to FIG. 1, a circuit diagram of a portion of a memory device 100 in accordance with one illustrative embodiment of the present invention is provided. The memory device 100 includes word lines (WL1) 102, (WL0) 104, and data lines 106 (DL), 108 (DL__). Memory cells 110, 111 are coupled to the word lines 102, 104 and data lines 106, 108 as shown. In the illustrated embodiment, the memory device 100 has an operating voltage designated as VCC. An intermediate voltage, DVC2, is employed in certain situations. The intermediate voltage DVC2 is approximately half the operating voltage VCC. The memory device 100 includes logic 109 for generating the various timing signals discussed herein. Generation of particular logic schemes to implement the timing relationships discussed is within the capabilities of one of ordinary skill in the art, and is not described in greater detail for clarity and to avoid obscuring the instant invention.

The illustrative memory cell 110 includes a transistor 112 and associated capacitor 114. The gate of the transistor 112 is coupled to the word line 102, and the transistor 112 is coupled between the capacitor 114 and the data line 106. The capacitor is also coupled to a DVC2 voltage source 115. When the word line 102 is asserted, the transistor 112 is enabled to allow charge stored in the capacitor 114 to transfer to the data line 106. If the capacitor 114 has a stored charge corresponding to a logic "1", the voltage on the data line 106 will be slightly higher than the voltage on the data line 108. If the capacitor 114 is not charged, the voltage on the data line 106 will drop relative to that on the data line 108, corresponding to a logic "0" condition. The memory cell 111 represents an adjacent memory cell having a transistor 116 coupled to the data line 108 and a gate by the word line 104. A capacitor 118 is coupled between the transistor 116 and the DVC2 voltage source 115. Fur purposes of illustration, the operation of the memory device 100 is described as it functions relative to the memory cell 110.

The memory device 100 includes a sense amp 120 that senses the small voltage difference on the data lines 106, 108 and amplifies that difference until the particular data line 106, 108 having the increased voltage is brought to VCC and the other data line 106, 108 is brought to ground (GND). Prior to the reading of the memory cell 110, the sense amp 120 equilibrates the data lines 106, 108 such that they both have a voltage of DVC2. The sense amp 120 includes transistors 122, 124 coupled to the data lines 106, 108. A DVC2 voltage source 126 is coupled to a bleeder circuit 127, which is, in turn, coupled to the transistors 122, 124. The transistors 122, 124 are enabled by an assertion of an equilibrate signal (EQ) thus coupling the data lines 106, 108 to the DVC2 voltage source 126 through the bleeder circuit 127. A transistor 128 is provided that couples the data lines 106, 108 to one another responsive to an assertion of the EQ signal to further ensure that the data lines 106, 108 are at the same voltage, DVC2. The bleeder circuit 127 limits WL-DL short circuit connections as described in U.S. Pat. No. 6,078,538, incorporated above.

The sense amp 120 further includes cross-coupled p-type transistors 130, 132 and n-type transistors 134, 136. The p-type transistors 130, 132 are coupled between the respective data lines 106, 108 and a pullup activation line 138 (represented by a signal PUACT). The n-type transistors 134, 136 are coupled between the respective data lines 106, 108 and a pulldown activation line 140 (represented by a signal PDACT__). The pullup and pulldown activation lines 138, 140 may be referred to collectively as sense amp activation lines 138, 140.

A transistor 142 is coupled between a VCC voltage source 144 and the pullup activation line 138 and is enabled responsive to an assertion of a pullup enable signal (PUEN__). A transistor 146 is coupled between a ground source 148 and the pulldown activation line 140 and is enabled responsive to the assertion of a pulldown enable signal (PDEN).

A transistor 150 is coupled between a ground voltage source 152 and the pullup activation line 138 and is enabled responsive to an assertion of the EQ signal. A transistor 154 is coupled between a DVC2 voltage source 156 and the pulldown activation line 140 and is enabled responsive to the assertion of the EQ signal. Hence, during the assertion of the EQ signal, the data lines 106, 108 are equilibrated to DVC2, as described above, the pullup activation line 138 is grounded, and the pulldown activation line 140 is equilibrated to DVC2. Although the transistors 142, 146, 150, 154 are not included in the box representing the sense amp 120, they are considered part of the sense amp 120.

Grounding the pullup activation line 138 is beneficial for reducing bleed currents in the memory device 100 due to short circuits between data lines, as described in the above-mentioned patent. These shorts result in higher standby currents during equilibrating cycles. This standby current may be limited using a bleeder circuit as is described above.

The memory device 100 further includes a sense amp equilibration circuit 160. In one embodiment, the sense amp equilibration circuit 160 includes a transistor 162 coupled between the pullup activation line 138 and the DVC2 voltage source 156. The transistor 162 is enabled responsive to the assertion of a sense amp equilibration (SAEQ) signal to bring the voltage on the pullup activation line 138 to DVC2 responsive to the SAEQ assertion.

Figure 2:
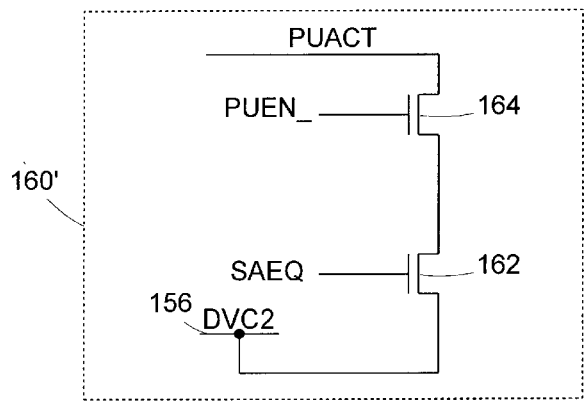
FIG. 2 is a circuit diagram of an alternative embodiment of a sense amp equilibration circuit that may be used in the memory device of FIG. 1.

Turning briefly to FIG. 2, an alternative embodiment of a sense amp equilibration circuit 160' is provided. In the alternative embodiment, an additional transistor 164 enabled by the PUEN__ signal is provided between the transistor 162 and the pullup activation line 138. In this embodiment, the pullup activation line 138 is equilibrated to DVC2 responsive to an assertion of both the SAEQ and the PUEN__ signals.

Figure 3A:
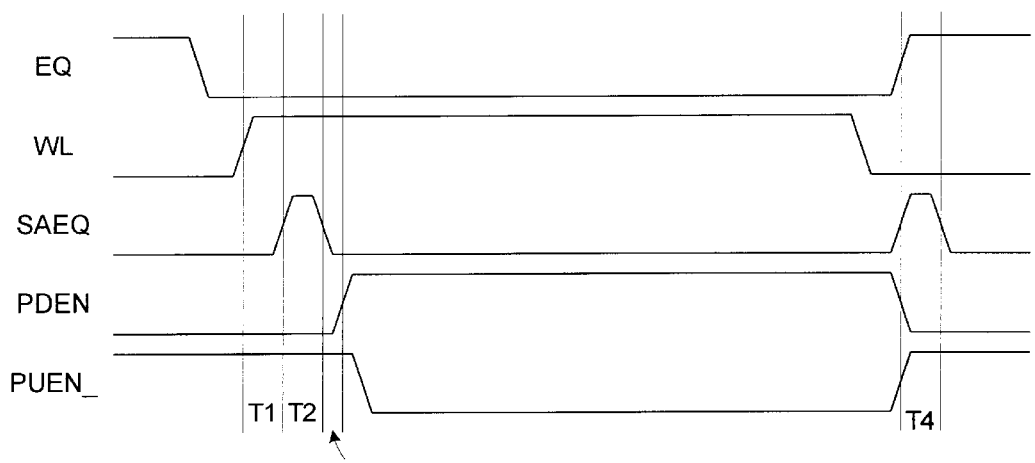
FIGS. 3A through 3C are timing diagrams illustrating the operation of the memory device of FIG. 1.
Figure 3B:
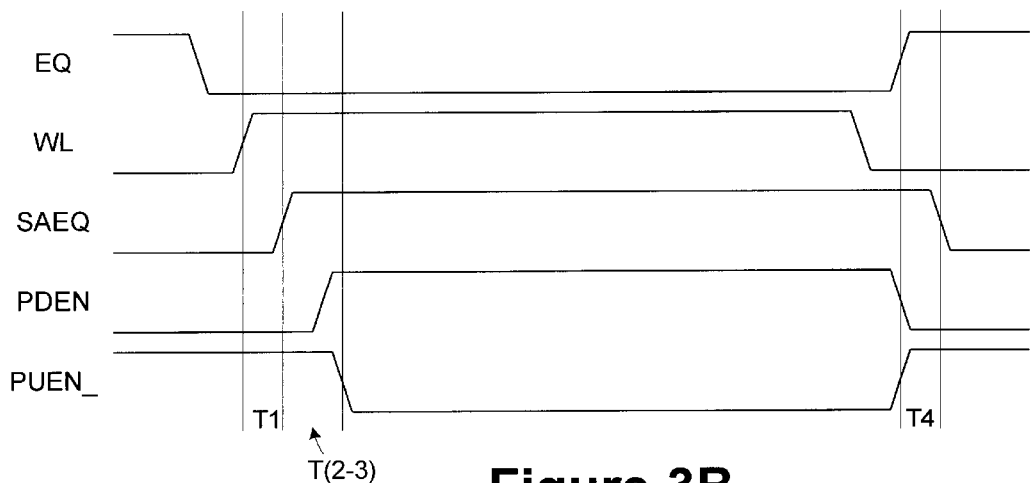
Figure 3C:
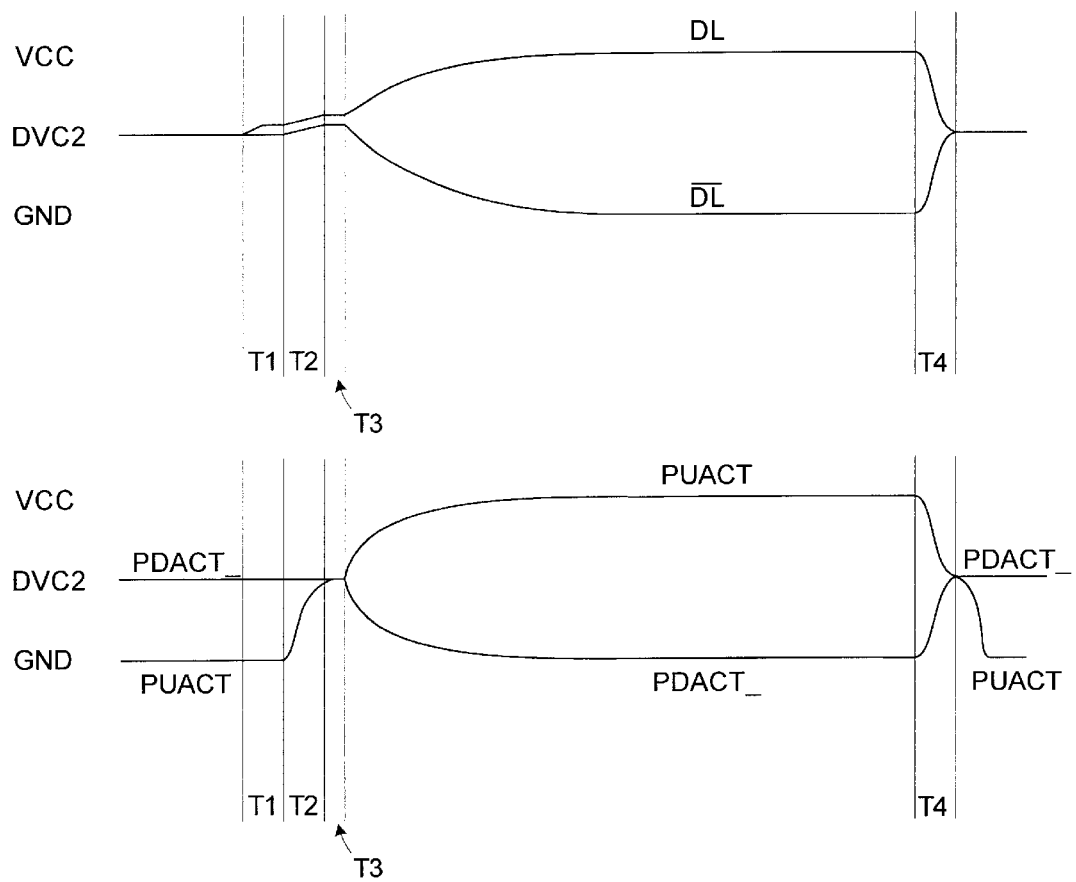

The operation of the memory device 100 of FIG. 1 is now described in conjunction with the timing diagrams illustrated in FIGS. 3A through 3C. FIG. 3A represents the timing arrangement used with the first embodiment of the sense amp equilibration circuit 160, while FIG. 3B illustrates the timing arrangement used in conjunction with the second embodiment of the sense amp equilibration circuit 160' shown in FIG. 2. FIG. 3C depicts the behavior of the PUACT, PDACT_, DL, and DL_ signals during the timing events shown in FIGS. 3A and 3B. The response shown in FIG. 3A is essentially the same for both embodiments of the sense amp equilibration circuit 160, 160'.

The following example illustrates timing for a read operation performed on the memory device 100. For purposes of illustration, assume that a logic "1" is stored in the memory cell 110. As shown in FIG. 3A, the EQ signal is asserted prior to the read operation, thus equilibrating the data lines 106, 108 by enabling the transistors 122, 124, 128, equilibrating the pull down activation line 140 (PDACT_) by enabling the transistor 154, and grounding the pullup activation line 138 (PUACT) by enabling the transistor 150. The EQ signal is deasserted prior to commencement of the read operation.

At time period T1, the read operation commences and the word lines 102, 104 are asserted (WL). Asserting the word line 102 enables the transistor 112 to allow the charge on the capacitor 114 to transfer to the data line 106. Because in the illustrated example a logic "1" was previously stored in the memory cell 110, the voltage seen on the data line 106 is higher than that seen on the data line 108.

At time period T2, the SAEQ signal is asserted enabling the transistor 162 and thus pre-enabling the pullup activation line 138 by bringing PUACT to DVC2. This condition improves the response time of the sense amp 120. A first speed improvement is provided because a greater $V_{GS}$ is present for the transistors 134, 136. When PUACT is pre-enabled from GND to DVC2, the data lines 106, 108 are coupled by the transistors 130, 132. Because $V_{GS}$ is greater, the response is increased when PDACT_ goes low. A second speed improvement is realized because PUACT activates from DVC2 instead of GND, thus enabling one of the PMOS transistors 130, 132 more quickly.

At time period T3, the PDEN signal is asserted, enabling the transistor 146 and coupling the pulldown activation line to the ground source 148. The slightly higher voltage present on the data line 106 resulting from the charge transfer from the memory cell 110 enables the transistor 136, which starts pulling the data line 108 (DL_) to ground. Shortly after the PDEN signal is asserted, the PUEN_ signal is asserted, enabling the transistor 142 and coupling the pullup activation line to the VCC voltage source 144. As the voltage on the data line 108 (DL_) drops, the transistor 130 is enabled, which starts pulling the data line 106 (DL_) to VCC.

If the memory cell 110 had stored a logic "0," the situation would have been reversed. The transistor 134 would have been enabled by the higher voltage on the data line 108 (DL_) bringing the data line 106 (DL) to ground, and the transistor 132 would have been enabled to bring the data line 108 (DL_) to VCC.

Time period T4 represents the end of the read cycle. The word line 102 is deasserted first. Then the PDEN and PUEN_ signals are deasserted and the SAEQ signal is asserted in conjunction with the EQ signal. The SAEQ signal enables the transistor 162, and the EQ signal enables the transistors 150, 154. Hence, the pullup activation line 138 and the pulldown activation line 140 are momentarily coupled together, allowing charge sharing to occur. Some of the charge on the pullup activation line 138 (PUACT is at VCC) is transferred to the pulldown activation line 140 (PDACT_ is at ground), which reduces the current draw on the DVC2 voltage source 156 when equilibrating the pulldown activation line 140 (PDACT_). This reduced current draw equates to a power savings for the memory device 110, making it more efficient. After the SAEQ signal is deasserted, the pullup activation line 138 is pulled to ground because the SAEQ signal is asserted, enabling the transistor 150. In the illustrated embodiment the transistor 150 is a relatively small conductance device, since it draws current during the SAEQ pulse for equilibrating PUACT and PDACT_. If the duration of the SAEQ pulse were increased or the transistor 150 were too have a greater conductance, the leakage current through the DVC2 source 156, the transistor 162, and the ground voltage source 152 would increase power consumption.

The sense amp equilibration circuit 160' operates in the same logic manner as the sense amp equilibration circuit 160. The transistors 162, 164 construct a logical AND condition (SAEQ AND PUEN_). Using this configuration, the SAEQ signal may remain asserted throughout the read cycle, but the sense amp equilibration circuit 160' is only operative during the time period (T2–3) and T4, as shown in FIG. 3B. The effect is the same as that of the sense amp equilibration circuit 160, as illustrated by the fact that the waveforms for the data lines 106, 108 (DL and DL_) and activation lines 138, 140 (PUACT and PDACT_) shown in FIG. 3C remain the same.

Figure 4:
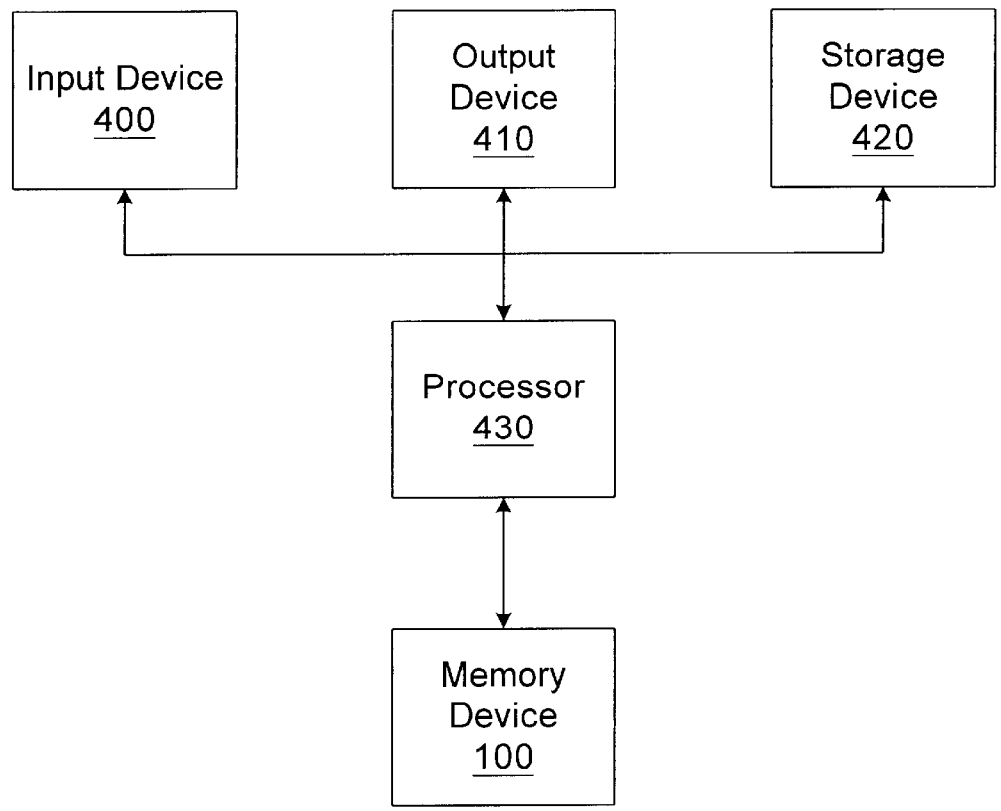
FIG. 4 is a simplified block diagram of a computer system incorporating the memory device of FIG. 1.

Turning now to FIG. 4, a simplified block diagram of a computer system 400 is provided. The computer system 400 includes an input device 410, such as a keyboard, an output device 420, such as a video monitor, and a storage device 430, such as a hard disk drive, all coupled to a conventional processor 440. The computer system 400 further includes the memory device 100 described in conjunction with FIGS. 1 through 3C coupled to the processor 440.

Equilibrating the sense amp activation lines 138, 140 prior to the read cycle, as described herein, decreases the response time of the sense amp 120 without compromising the standby current savings achieved by grounding the pullup activation line 138 during the equilibration stage.

The exemplary circuit layouts used to illustrate the memory cells 110 and sense amps 120 described above represent conventional circuits employed in the art. However, the present invention may be applied to other memory cell and/or sense amp configurations.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A device, comprising:
   first and second data lines;
   a memory cell coupled to at least one of the first and second data lines;
   a sense amp coupled to the data lines, the sense amp comprising:
   sensing circuitry configured to detect a voltage on the data lines corresponding to charge stored in the memory cell;

a first activation line coupled between the sensing circuitry and a pullup voltage source; and a second activation line coupled between the sensing circuitry and a pulldown voltage source;

equilibration circuitry configured to ground the first activation line and equilibrate the second activation line responsive to an assertion of an equilibrate signal; and sense amp equilibration circuitry configured to equilibrate the first activation line responsive to an assertion of a sense amp equilibration signal prior to an activation of the second activation line.

2. The device of claim 1, wherein the sense amp equilibration circuitry further comprises a transistor coupled between the first activation line and an equilibration voltage source, the transistor having a gate input terminal coupled to receive the sense amp equilibration signal.

3. The device of claim 2, further comprising logic configured to deassert the equilibrate signal prior to a read cycle of the device and assert the sense amp equilibration signal after the deassertion of the equilibrate signal and the before initiating the read cycle.

4. The device of claim 3, wherein the logic is further configured to assert the equilibration signal and the sense amp equilibration signal after completion of the read cycle.

5. The device of claim 2, wherein the equilibration voltage source has a voltage that is about half the voltage of the pullup voltage source.

6. The device of claim 1, wherein the sensing circuitry includes:

a first transistor coupled between the first activation line and the first data line and having a gate input terminal coupled to the second data line;

a second transistor coupled between the first activation line and the second data line and having a gate input terminal coupled to the first data line;

a third transistor coupled between the second activation line and the first data line and having a gate input terminal coupled to the second data line; and a fourth transistor coupled between the second activation line and the second data line and having a gate input terminal coupled to the first data line.

7. The device of claim 1, further comprising a first transistor coupled between the pullup voltage source and the first activation line and having a gate input terminal coupled to receive a pullup enable signal.

8. The device of claim 7, wherein the sense amp equilibration circuitry further comprises second and third transistors coupled between the first activation line and an equilibration voltage source, one of the second and third transistors having a gate input terminal coupled to receive the sense amp equilibration signal and the other of the second and third transistors having a gate input terminal coupled to receive the pullup enable signal, the one of the second and third transistors having the gate input terminal coupled to receive the pullup enable signal being enabled responsive to the pullup enable signal being in a deasserted state.

9. The device of claim 8, further comprising logic configured to deassert the equilibrate signal and the pullup enable signal prior to a read cycle of the device, assert the sense amp equilibration signal after the deassertion of the equilibrate signal, and assert the pullup enable signal after assertion of the sense amp equilibration signal.

10. The device of claim 9, wherein the logic is further configured to assert the equilibration signal, assert the sense amp equilibration signal, and deassert the pullup enable signal after completion of the read cycle.

11. A device, comprising:

first and second data lines;

a memory cell coupled to at least one of the first and second data lines;

a sense amp coupled to the data lines, the sense amp comprising:

a first activation line coupled to a pullup voltage source;

a second activation line coupled to pulldown voltage source;

a first transistor coupled between the first activation line and the first data line and having a gate input terminal coupled to the second data line;

a second transistor coupled between the first activation line and the second data line and having a gate input terminal coupled to the first data line;

a third transistor coupled between the second activation line and the first data line and having a gate input terminal coupled to the second data line; and a fourth transistor coupled between the second activation line and the second data line and having a gate input terminal coupled to the first data line;

equilibration circuitry configured to ground the first activation line and equilibrate the second activation line responsive to an assertion of an equilibrate signal; and sense amp equilibration circuitry configured to equilibrate the first activation line responsive to an assertion of a sense amp equilibration signal prior to an activation of the second activation line.

12. The device of claim 11, wherein the sense amp equilibration circuitry further comprises a fifth transistor coupled between the first activation line and an equilibration voltage source, the fifth transistor having a gate input terminal coupled to receive the sense amp equilibration signal.

13. The device of claim 12, further comprising logic configured to deassert the equilibrate signal prior to a read cycle of the device and assert the sense amp equilibration signal after the deassertion of the equilibrate signal and the before initiating the read cycle.

14. The device of claim 13, wherein the logic is further configured to assert the equilibration signal and the sense amp equilibration signal after completion of the read cycle.

15. The device of claim 12, wherein the equilibration voltage source has a voltage that is about half the voltage of the pullup voltage source.

16. The device of claim 11, further comprising a fifth transistor coupled between the pullup voltage source and the first activation line and having a gate input terminal coupled to receive a pullup enable signal.

17. The device of claim 16, wherein the sense amp equilibration circuitry further comprises sixth and seventh transistors coupled between the first activation line and an equilibration voltage source, one of the sixth and seventh transistors having a gate input terminal coupled to receive the sense amp equilibration signal and the other of the sixth and seventh transistors having a gate input terminal coupled to receive the pullup enable signal, the one of the sixth and seventh transistors having the gate input terminal coupled to receive the pullup enable signal being enabled responsive to the pullup enable signal being in a deasserted state.

18. The device of claim 17, further comprising logic configured to deassert the equilibrate signal and the pullup enable signal prior to a read cycle of the device, assert the sense amp equilibration signal after the deassertion of the equilibrate signal, and assert the pullup enable signal after assertion of the sense amp equilibration signal.

19. The device of claim 18, wherein the logic is further configured to assert the equilibration signal, assert the sense amp equilibration signal, and deassert the pullup enable signal after completion of the read cycle.

20. A method for reading a memory cell, comprising:
providing a memory cell coupled to at least one of first and second data lines;
providing sensing circuitry for sensing a voltage on the data lines corresponding to charge stored in the memory cell;
coupling a first activation line between the sensing circuitry and a pullup voltage source;
coupling a second activation line between the sensing circuitry and a pulldown voltage source;
grounding the first activation line and equilibrating the second activation line responsive to an assertion of an equilibrate signal; and
equilibrating the first activation line responsive to an assertion of a sense amp equilibration signal prior to a read cycle of the device.

21. The method of claim 20, wherein the sense amp equilibration circuitry further comprises a transistor coupled between the first activation line and an equilibration voltage source, the transistor having a gate input terminal coupled to receive the sense amp equilibration signal.

22. The method of claim 21, further comprising:
deasserting the equilibrate signal prior to a read cycle; and
asserting the sense amp equilibration signal after the deassertion of the equilibrate signal and the before initiation of the read cycle.

23. The method of claim 22, further comprising asserting the equilibration signal and the sense amp equilibration signal after completion of the read cycle.

24. The method of claim 20, further comprising coupling the pullup voltage source to the first activation line responsive to an assertion of a pullup enable signal.

25. The method of claim 24, further comprising coupling the pullup voltage source to the first activation line responsive to an assertion of a pullup enable signal and a deassertion of the pullup enable signal.

26. The method of claim 25, further comprising:
deasserting the equilibrate signal and the pullup enable signal prior to a read cycle of the device;
asserting the sense amp equilibration signal after the deassertion of the equilibrate signal; and
asserting the pullup enable signal after assertion of the sense amp equilibration signal.

27. The method of claim 26, further comprising asserting the equilibration signal, asserting the sense amp equilibration signal, and deasserting the pullup enable signal after completion of the read cycle.

28. A computer system, comprising:
a processor; and
a memory device coupled to the processor, the memory device comprising:
first and second data lines;
a memory cell coupled to at least one of the first and second data lines;
a sense amp coupled to the data lines, the sense amp comprising:
sensing circuitry configured to detect a voltage on the data lines corresponding to charge stored in the memory cell;
a first activation line coupled between the sensing circuitry and a pullup voltage source; and
a second activation line coupled between the sensing circuitry and a pulldown voltage source;
equilibration circuitry configured to ground the first activation line and equilibrate the second activation line responsive to an assertion of an equilibrate signal; and
sense amp equilibration circuitry configured to equilibrate the first activation line responsive to an assertion of a sense amp equilibration signal prior to an activation of the second activation line.

29. The computer system of claim 28, wherein the sense amp equilibration circuitry further comprises a transistor coupled between the first activation line and an equilibration voltage source, the transistor having a gate input terminal coupled to receive the sense amp equilibration signal.

30. The computer system of claim 29, further comprising logic configured to deassert the equilibrate signal prior to a read cycle of the memory device and assert the sense amp equilibration signal after the deassertion of the equilibrate signal and the before initiating the read cycle.

31. The computer system of claim 30, wherein the logic is further configured to assert the equilibration signal and the sense amp equilibration signal after completion of the read cycle.

32. The computer system of claim 29, wherein the equilibration voltage source has a voltage that is about half the voltage of the pullup voltage source.

33. The computer system of claim 28, wherein the sensing circuitry includes:
a first transistor coupled between the first activation line and the first data line and having a gate input terminal coupled to the second data line;
a second transistor coupled between the first activation line and the second data line and having a gate input terminal coupled to the first data line;
a third transistor coupled between the second activation line and the first data line and having a gate input terminal coupled to the second data line; and
a fourth transistor coupled between the second activation line and the second data line and having a gate input terminal coupled to the first data line.

34. The computer system of claim 28, further comprising a first transistor coupled between the pullup voltage source and the first activation line and having a gate input terminal coupled to receive a pullup enable signal.

35. The computer system of claim 34, wherein the sense amp equilibration circuitry further comprises second and third transistors coupled between the first activation line and an equilibration voltage source, one of the second and third transistors having a gate input terminal coupled to receive the sense amp equilibration signal and the other of the second and third transistors having a gate input terminal coupled to receive the pullup enable signal, the one of the second and third transistors having the gate input terminal coupled to receive the pullup enable signal being enabled responsive to the pullup enable signal being in a deasserted state.

36. The computer system of claim 35, further comprising logic configured to deassert the equilibrate signal and the pullup enable signal prior to a read cycle of the memory device, assert the sense amp equilibration signal after the deassertion of the equilibrate signal, and assert the pullup enable signal after assertion of the sense amp equilibration signal.

37. The computer system of claim 36, wherein the logic is further configured to assert the equilibration signal, assert the sense amp equilibration signal, and deassert the pullup enable signal after completion of the read cycle.

* * * * *